United States Patent [19]

Kawakami et al.

[11] Patent Number: 5,272,645
[45] Date of Patent: Dec. 21, 1993

[54] CHANNEL ROUTING METHOD

[75] Inventors: Yoshiyuki Kawakami, Neyagawa; Masahiko Toyonaga, Takatsuki, both of Japan

[73] Assignee: Matsushita Electric Industrial Co., Ltd., Osaka, Japan

[21] Appl. No.: 704,181

[22] Filed: May 22, 1991

[30] Foreign Application Priority Data

May 24, 1990 [JP] Japan .................................. 2-135069

[51] Int. Cl.⁵ ............................................ G06F 15/60
[52] U.S. Cl. .................................... 364/491; 364/490; 364/489; 364/488
[58] Field of Search ................. 364/488, 489, 490, 491

[56] References Cited

U.S. PATENT DOCUMENTS

| | | | |
|---|---|---|---|
| 4,500,963 | 2/1985 | Smith et al. | 364/491 |
| 4,636,965 | 1/1987 | Smith et al. | 364/491 |
| 4,823,276 | 4/1989 | Hiwatashi | 364/491 |
| 5,047,949 | 9/1991 | Yamaguchi et al. | 364/491 |

OTHER PUBLICATIONS

"An Over-Cell Gate Array Channel Router" by H. E. Krohn, IEEE 20th Design Automation Conf., 1983, pp. 665–670.

"Automatic Wiring Procedure in Interative Type Printed Substrate Design System" by M. Togashi, 30th National Conference (First Half of 1985), of the Information Processing Society of Japan, pp. 1903–1904.

"Wire Routing by Optimizing Channel Assignment Within Large Apertures" Akihiro Hashimoto and James Stevens, pp. 155–169.

"A Dogleg Channel Router", David N. Deutsch, pp. 424–433.

"Efficient Algorithms for Channel Routing", Takeshi Yoshimura and Ernest S. Kuh, vol. CAD-1, No. 1, Jan. 1982, pp. 24–35.

"A Greedy" Channel Router, Ronald L. Rivest and Charles M. Fiduccia Mar. 1981, pp. 418–425.

"Hierarchical Channel Router", Michael Burstein and Richard Pelavin, pp. 590–597.

"A New Gridless Channel Router", Alberto Sangiovanni-Vincentelli, Mauro Santomauro and Jim Reed, pp. 72–75.

"A Variable-Width Gridless Channel Router", Howard H. Chen and Ernest S. Kuh, pp. 304–307.

"A general Greedy Channel Routing Algorithm", Tai-Tsung Ho et al., IEEE Transactions on Computer-Aided Design, vol. 10, No. 2, Feb. 1991, pp. 204–211.

Primary Examiner—Vincent N. Trans
Attorney, Agent, or Firm—Wenderoth, Lind & Ponack

[57] ABSTRACT

A plurality of wires are effectively laid in a channel having a plurality of wiring layers and sandwiched between two rows of terminals. In order to complete channel routing, horizontal segments of the wires are initially generated. The horizontal segments are then allocated on at least one imaginary segment generated on each layer contained in the channel. The imaginary segment is in parallel with the rows of terminals in the channel. The horizontal segments are bent for reduction of the channel height based on design rules for each layer. Finally, vertical segments of the wires are generated.

1 Claim, 7 Drawing Sheets

CHANNEL ROUTING METHOD

BACKGROUND OF THE INVENTION

1. Field of the Invention

The present invention relates to a channel routing method in the layout design of a VLSI or the like.

2. Description of the Prior Art

Conventional channel routing methods include (1) methods which minimize the number of tracks and (2) methods which minimize the channel height.

Typically, the methods (1) include a grid based channel routing algorithm. For example, such methods are disclosed in "Wire routing by optimizing channel assignment" (Proc. 8th Design Automation Workshop, 1971, pp. 155-169), "A dogleg channel router" (Proc. 13th Design Automation Conf., 1976, pp. 425-433), "Efficient algorithms for channel routing" (IEEE Trans. Computer-Aided Design, vol, CAD-1, pp. 25-35, 1982), "A greedy channel router" (Proc. 19th Design Automation Conf., 1982, pp. 418-424), "Hierarchical channel router" (Proc. 20th Design Automation Conf., 1983, pp. 591-597), and "A new gridless channel router: YACR2" (Proc. of the IEEE International Conference on Computer-Aided Design, ICCAD-84, 1984, pp. 72-75). In the these methods, wiring is carried out without considering the wire width, namely, assuming that the wire widths are all the same. Since no consideration is given to design rules (except for the YACR2 method), the wire spacing is left sufficient to satisfy them even though contacts are located side by side. Therefore, minimization in channel height leads to minimization in the number of tracks.

"A variable width gridless channel router" (Proc. of International Conference on Computer-Aided Design, 1985, pp. 304-306) describes a typically known one of the methods (2). In this method, since both the wire width and the design rules are taken into consideration, the wire spacing obtained thereby is regarded as the minimum spacing in the design rules. As such, this method provides a solution which is more favorable than the methods (1) in channel height.

According to the methods (1), since channel routing is performed on the condition that the wire width is constant, the methods (1) cannot provide the optimum channel height when a plurality of wire widths exist. Further, an excessive space is formed because no consideration is given to the wire spacing, as described previously.

The above-described problem inherent in the methods (1) does not occur in the methods (2). The XY technique is used in the methods (2). According to the XY technique in two-layer channel routing, horizontal segments are placed on the first layer (second layer) whereas vertical segments are placed on the second layer (first layer). Accordingly, the horizontal segments and the vertical segments are never placed on the same layer. As a result, this method cannot provide high density channel routing by effectively making use of the two layers.

SUMMARY OF THE INVENTION

The present invention has been developed to overcome the above-described disadvantages.

It is accordingly an object of the present invention to provide an improved channel routing method capable of performing high density channel routing with a reduced channel height by taking the channel width and spacing into consideration and without using of the XY technique.

The channel routing method according to the present invention aims at routing a plurality of wires in a channel having a plurality of layers formed therein and sandwiched between two rows of terminals. The method includes the steps of:

(a) generating horizontal segments required for completing a wiring in the channel;

(b) allocating the horizontal segments on at least one imaginary segment generated on each layer contained in the channel, the imaginary segment being in parallel with the rows of terminals in the channel;

(c) bending the horizontal segments for reduction of a channel height based on design rules for each layer; and (d) generating vertical segments of the wires.

Preferably, the above step (b) includes the steps of:

(b1) determining an allocation order of the horizontal segments based on a positional relationship among the terminals;

(b2) selecting from the horizontal segments candidates which can be allocated on a single imaginary segment;

(b3) calculating a longest path length on an expanded vertical constraint graph required for completing the channel routing;

(b4) estimating in advance a channel height required for completing the channel routing;

(b5) enumerating locations of wiring densities greater than a given value, the wiring density being equal to a sum of widths of the horizontal segments and intervals between the horizontal segments along a vertical segment lying between the rows of terminal;

(b6) calculating a degree of crossing between each horizontal segment and vertical segments having respective wiring densities;

(b7) calculating an attraction of each horizontal segment toward one of an upper side and a lower side of the channel;

(b8) calculating a degree of allocation priority of each horizontal segment; and (b9) selecting horizontal segments from the aforementioned candidates and allocating selected horizontal segments on the imaginary segment based on a result obtained at at least one of steps (b3), (b6), (b7), and (b8).

The steps (b1) to (b9) are repeated until the horizontal segments are all allocated.

BRIEF DESCRIPTION OF THE DRAWINGS

This and other objects and features of the present invention will become more apparent from the following description taken in conjunction with the preferred embodiment thereof with reference to the accompanying drawings, throughout which like parts are designated by like reference numerals, and wherein.

DETAILED DESCRIPTION OF THE INVENTION

Figure 1:
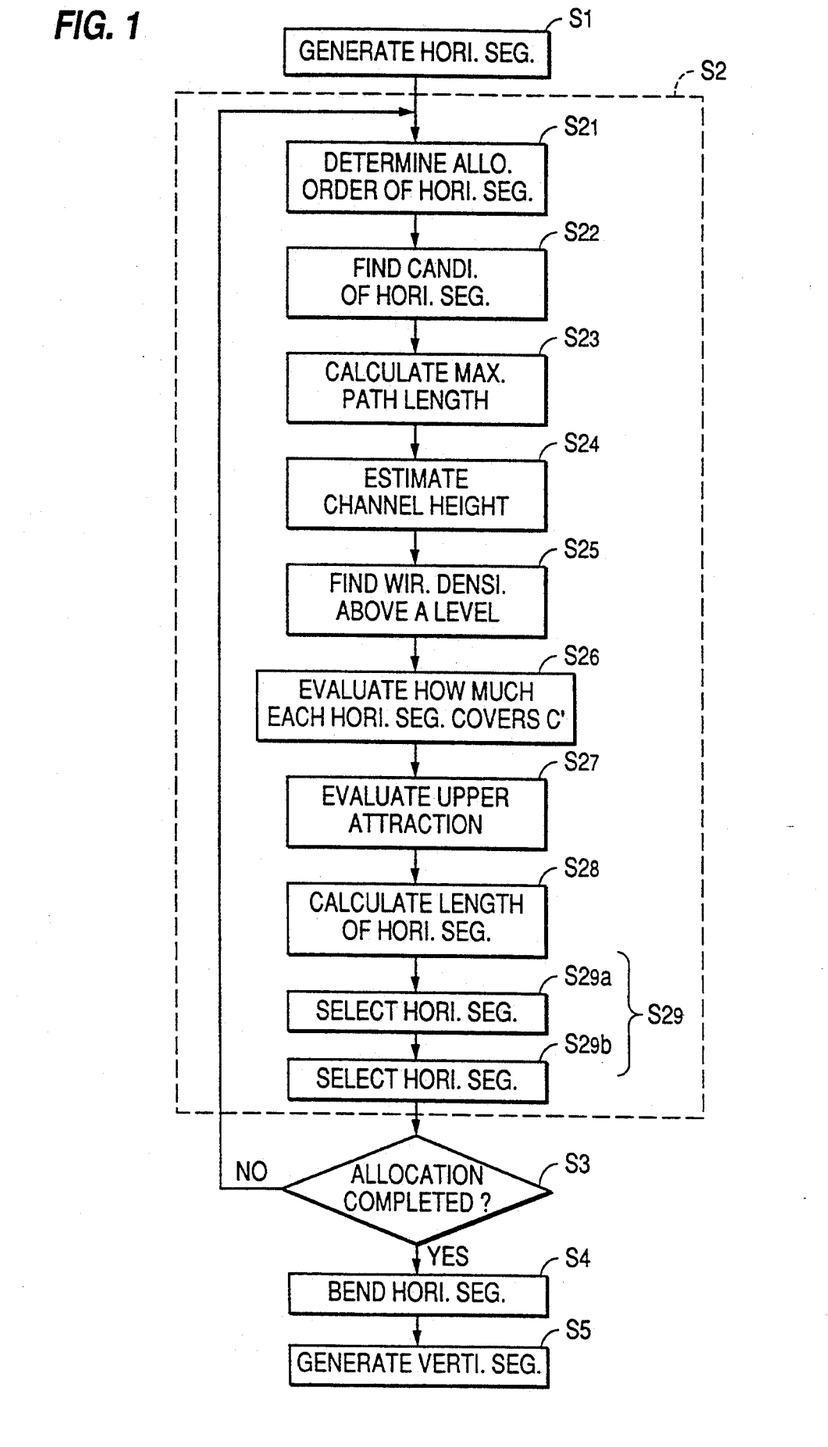
FIG. 1 is a flow-chart indicative of a procedure according to the present invention.

Referring now to the drawings, there is shown in FIG. 1 a flow-chart indicative of a procedure embodying the present invention.

As shown in FIG. 1, the procedure of the present invention is broadly classified into step 1 for generating horizontal segments in a generally rectangular wiring region called a "channel" sandwiched between two rows of terminals, a series of steps 2 ($2_1$–$2_9$) and step 3 for allocating the horizontal segments, step 4 for bending the horizontal segments, and step 5 for generating vertical segments. The series of steps 2 include step $2_1$ for determining the allocation order of the horizontal segments, step $2_2$ for finding candidates of the horizontal segments, step $2_3$ for calculating the longest path length, step $2_4$ for estimating the channel height, step $2_5$ for finding wiring densities greater than a certain value, step $2_6$ for calculating the number of wiring densities, step $2_7$ for calculating upper side attractions, step $2_8$ for calculating the length of the horizontal segments, and step $2_9$ for selecting the horizontal segments.

At step 1, all horizontal segments required for completing channel routing are initially enumerated. The horizontal segments to be generated are horizontal segments each belonging to a two-terminal net, which is known in the so-called "dogleg" algorithm. A set of enumerated horizontal segments is denoted as H. At the series of steps 2, imaginary segments in parallel with two rows of terminals are generated on each layer in a channel, thus allocating the horizontal segments of wiring on the imaginary segments. When the horizontal segments have been allocated on the imaginary segments, the horizontal segments are removed from the set H of horizontal segments. This operation is performed until all terminals are connected as required, i.e., until the set H of horizontal segments becomes empty.

Figure 2A:
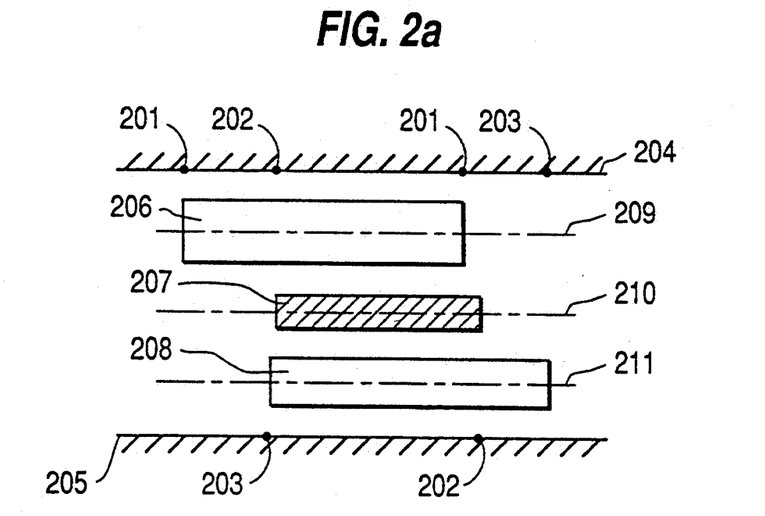
FIGS. 2a to 2c are a series of schematic views indicative of a wiring processing.

The operation is described with reference to FIG. 2a. Reference numeral 201 denotes a terminal of a net 1 of a width 4 on a second layer; 202 denotes a terminal of a net 2 of a width 2 on a second layer; 203 denotes a terminal of a net 3 of a width 3 on the second layer; 204 denotes the upper side of the channel; and 205 denotes the lower side of the channel. Furthermore, reference numeral 206 denotes a horizontal segment of the net 1 of the width 4 on the first layer; 207 denotes a horizontal segment of the net 2 of the width 2 on the second layer; 208 denotes a horizontal segment of the net 3 of the width 3 on the first layer; 209 denotes a first-layer imaginary segment of a first track; 210 denotes a second-layer imaginary segment of a second track; and 211 denotes a first-layer imaginary segment of a third track.

Figure 2B:
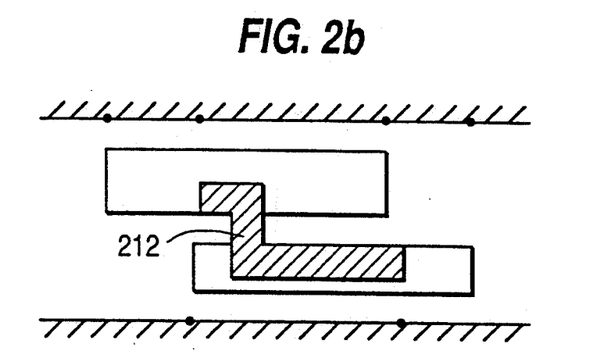

At step 4, some of the allocated horizontal segments are properly bent on the same layer in order to satisfy design rules and to minimize the final channel height. For example, the result obtained by the bending operation is shown in FIG. 2b, in which reference numeral 212 denotes a segment obtained by bending the horizontal segment 207.

At step 5, vertical segments are generated between terminals, between terminals and horizontal segments, and between horizontal segments on each layer in order to connect all terminals as required.

Figure 2C:
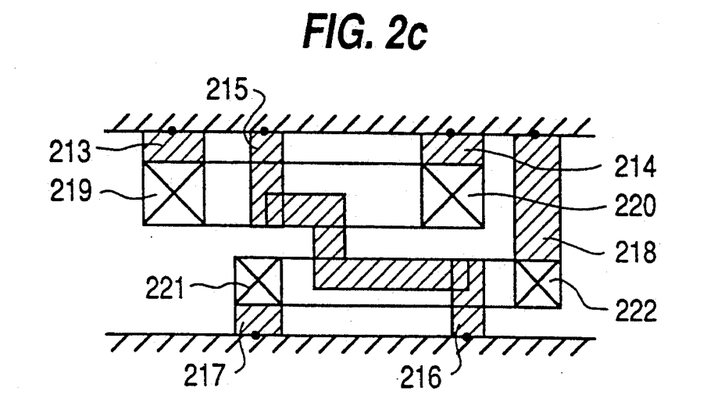

FIG. 2c depicts the final result, in which reference numeral 213 denotes a vertical segment of the second layer connecting a contact 219 and the terminal 201 with each other; 214 denotes a vertical segment of the second layer connecting a contact 220 and the terminal 201 with each other; 215 denotes a vertical segment of the second layer connecting the left end of a segment 212 and the terminal 202 with each other; and 216 denotes a vertical segment of the second layer connecting the right end of the segment 212 and the terminal 202 with each other. Furthermore, reference numeral 217 represents a vertical segment of the second layer connecting a contact 221 and the terminal 203 with each other; 218 represents a vertical segment of the second layer connecting a contact 222 and the terminal 203 with each other; 219 represent a contact connecting the segment 206 and the vertical segment 213 with each other; 220 represents a contact connecting the segment 206 and the vertical segment 214 with each other; 221 represents a contact connecting the segment 208 and the vertical segment 217 with each other; and 222 represents a contact connecting the segment 208 and the vertical segment 218 with each other.

At the series of steps 2, imaginary segments are sequentially generated from the upper side toward the lower side of the channel so that horizontal segments of the wiring may be allocated thereon. It is possible to arbitrarily generate imaginary segments, for example, from the lower side toward the upper side or alternately from the upper side and from the lower side. In this embodiment, the imaginary segments are generated from the upper side toward the lower side of the channel. The kind of imaginary segments to be generated in one loop from step $2_1$ to step $2_9$ is equal in number to (one track x the number of layers). The track means imaginary segments distinguished from each other in the horizontal direction. In this embodiment, two layers are available for channel routing. Because of this, the series of steps 2 include two steps $2_{9a}$ and $2_{9b}$ for selecting horizontal segments. In other words, the number of steps for selecting horizontal segments is equal to the number of layers.

Figure 3A:
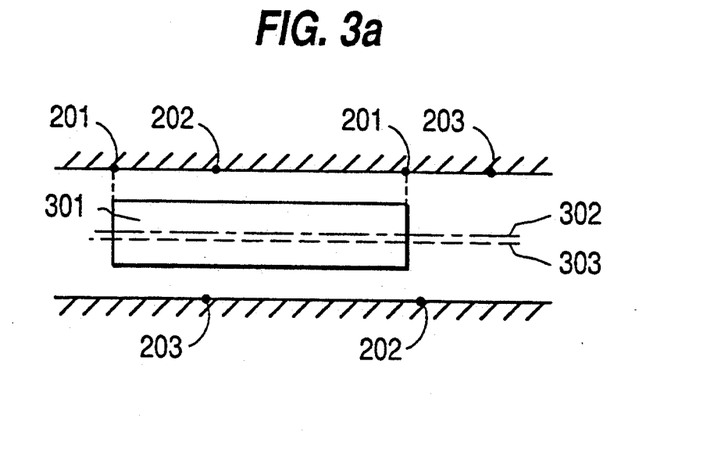
FIGS. 3a to 3c are a series of schematic views explanatory of a step for allocating horizontal segments.
Figure 3B:
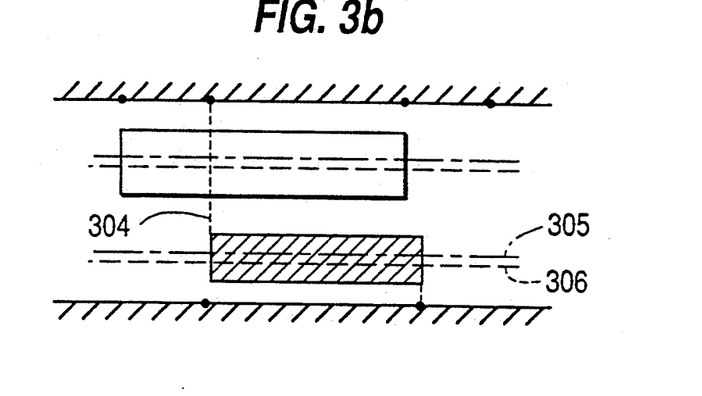
Figure 3C:
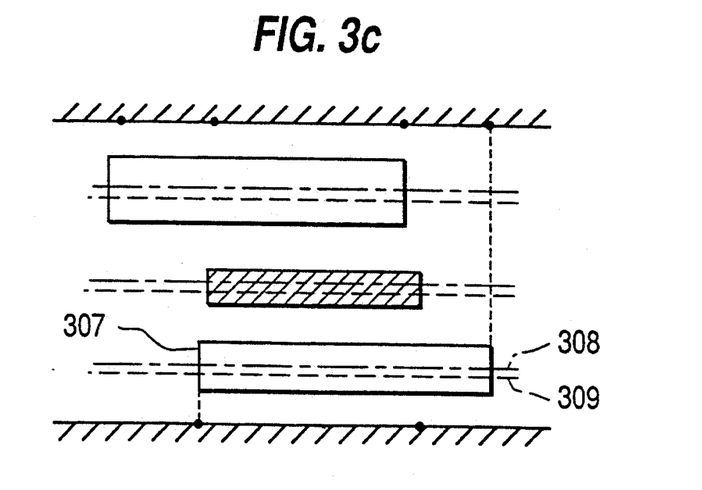

The loop for allocating the horizontal segments is discussed with reference to FIGS. 3a to 3c. A horizontal segment 301 is allocated on an imaginary segment 302 on the first layer. Reference numeral 303 denotes an imaginary segment of the second layer. A horizontal segment 304 is allocated on an imaginary segment 306 on the second layer. Reference numeral 305 denotes an imaginary segment of the first layer. A horizontal segment 307 is allocated on an imaginary segment 308 on the first layer. Reference numeral 309 denotes an imaginary segment of the second layer. Elements of the set H of horizontal segments generated at step 1 are the horizontal segments 301, 304, and 307. The imaginary segment 302 is generated and the horizontal segment 301 is allocated on the imaginary segment 302 in the first loop from step $2_1$ to step $2_9$, as shown in FIG. 3a. Thus, the horizontal segment 301 is removed from the set H of horizontal segments. It is to be noted that the horizontal segment 301 cannot be allocated on the imaginary segment 303. If the horizontal segment 301 is allocated on the imaginary segment 303 and all the other horizontal segments are allocated on the imaginary segment 302, the former and the latter are subjected to a short circuit because the terminals 201 to 203 are all allocated on the second layer.

Since the set H of horizontal segments is not yet empty at this stage, the second loop is carried out. Let it be assumed that the imaginary segment 306 is generated and the horizontal segment 304 is allocated on the imaginary segment 306 in this loop. Accordingly, the horizontal segment 304 is removed from the set H of horizontal segments. It is to be noted that the horizontal segment 304 can be allocated on any of the imaginary segments 305 and 306. Since two-layer overlap routing is performed according to the present invention, it is preferable to allocate this horizontal segment on an imaginary segment on the second layer. Since the set H of horizontal segments is not yet empty, the third loop is executed. Let it be assumed that the imaginary segment 308 is generated and the horizontal segment 307 is allocated on the imaginary segment 308 as shown in FIG. 3c. The horizontal segment 307 is removed from the set H of horizontal segments. Since the set H of horizontal segments becomes empty, the series of steps 2 for allocating the horizontal segments are terminated.

Steps $2_1$ to $2_9$ contained in the series of steps 2 are discussed in order.

Figure 4:
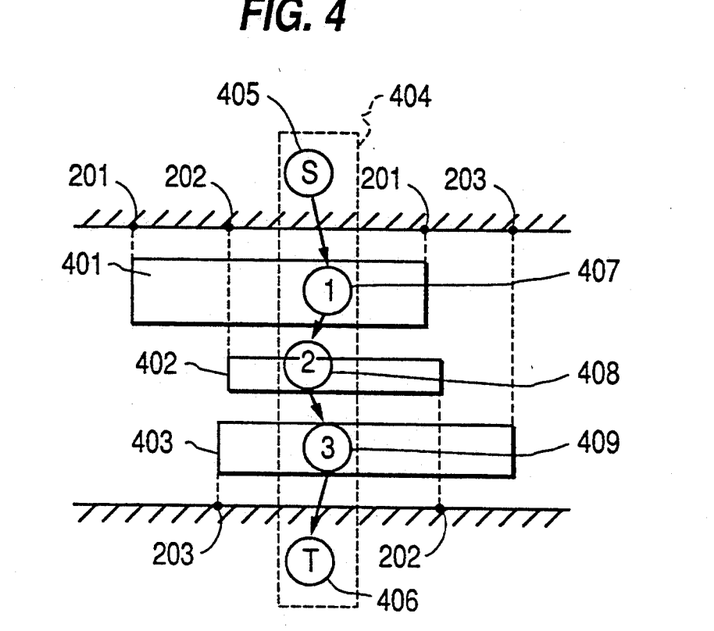
FIG. 4 is a schematic view explanatory of a step for determining the allocation order of the horizontal segments.

Step $2_1$ is initially discussed with reference to FIG. 4. Reference numeral 401 denotes a horizontal segment of a width 4 of a net 1; 402 denotes a horizontal segment of a width 2 of a net 2; 403 denotes a horizontal segment of a width 3 of a net 3; 404 denotes an expanded vertical constraint graph; 405 denotes a source in the graph 404; 406 denotes a sink in the graph 404; 407 denotes a vertex in a graph indicating the horizontal segment 401; 408 denotes a vertex in a graph indicating the horizontal segment 402; and 409 denotes a vertex in a graph indicating the horizontal segment 403. The vertical locations of the horizontal segments 401 to 403 are occasionally restricted by the positional relationship among the terminals 201, 202, and 203. The vertical constraint graph indicates this. This graph is generally used in channel routing problems. A conventionally known art "Recursive channel routing" (Proc. 25th Design Automation Conf., 1988, pp. 178-182) teaches the expanded vertical constraint graph, in which new information is added to the vertical constraint graph. The expanded vertical constraint graph is used in this embodiment.

In the expanded vertical constraint graph 404, the vertices 407 to 409 correspond to the horizontal segments 401 to 409, respectively, and a directed edge represents the vertical relationship between vertices located at both ends of the edge. For example, (vertex 407 →vertex 408) indicates that the horizontal segment having the vertex 407 needs to be allocated before the horizontal segment having the vertex 408 is allocated (above the horizontal segment having the vertex 408). In the expanded vertical constraint graph 404, the vertex 405 indicates a source in the graph and the vertex 406 indicates a sink. This graph 404 is generated at step $2_1$.

Step $2_2$ finds candidates of horizontal segments which can be allocated to a track closest to the upper side of the channel using the expanded vertical constraint graph 404. To this end, horizontal segments having respective vertices connected with the vertex 405 in the expanded vertical constraint graph 404 are all enumerated from the set H of horizontal segments. The set of the enumerated horizontal segments is denoted as H'. Each element of the set H' of horizontal segments has four attributes W1, W2, W3, and W4. These attributes are used at step $2_9$ as the selection reference of segments and are found at steps $2_3$ to $2_8$.

At step $2_3$, the degree of allocation priority is calculated with respect to horizontal segments L contained in the set H' of horizontal segments using the expanded vertical constraint graph 404. Equation (1) is used in this calculation and the calculation result means the attribute W1.

$$W1 = \Sigma \text{ (the width of a horizontal segment having a vertex located on the longest path extending from the source including vertices of the horizontal segments L to the sink)} + \text{(spacing design rule)} \times \text{(the number of vertices located on the longest path extending from the source including vertices of the horizontal segments L to the sink} + 1) \quad 1)$$

For example, the attribute W1 of the horizontal segment 401 is as follows: $W1 = (4+2+3) + (2 \times 4) = 17$. The spacing design rule means a reference interval between segments and is set to 2 in this embodiment.

Figure 5:
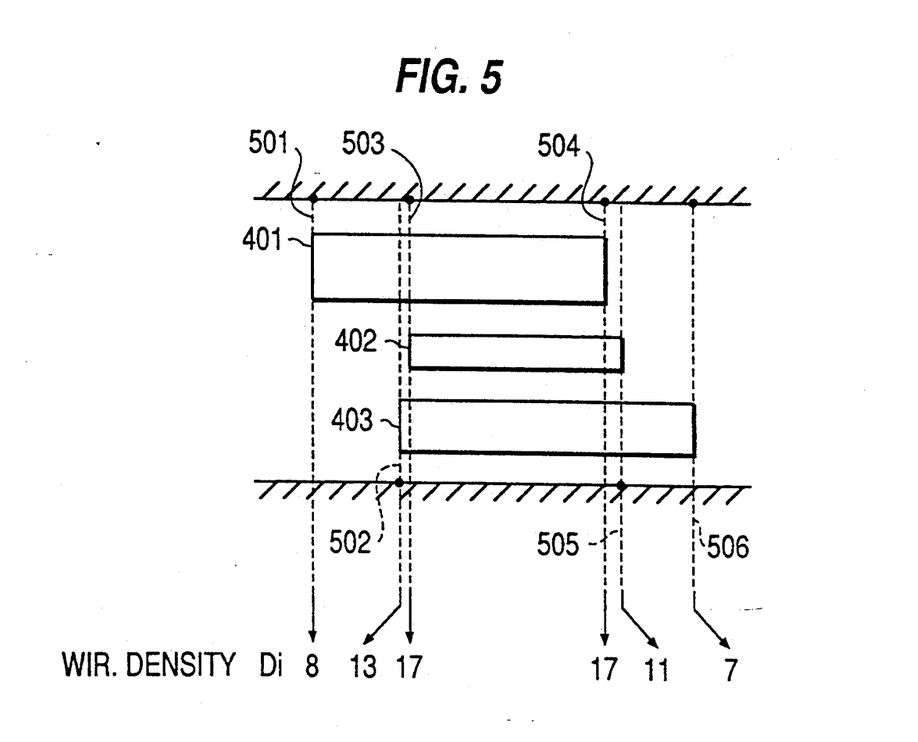
FIG. 5 is a schematic view explanatory of a step for estimating the channel height.

Step $2_4$ for estimating the channel height is described with reference to FIG. 5. A vertical segment 501 is contiguous to the left end of the horizontal segment 401. A vertical segment 502 is contiguous to the left end of the horizontal segment 403. A vertical segment 503 is contiguous to the left end of the horizontal segment 402. A vertical segment 504 is contiguous to the right end of the horizontal segment 401. A vertical segment 505 is contiguous to the right end of the horizontal segment 402. A vertical segment 506 is contiguous to the right end of the horizontal segment 403. Let a concept called "wiring density" be introduced herein. The wiring density is the sum of the total width of all horizontal segments crossing a vertical segment passing a certain position of a channel and the total interval between adjoining horizontal segments. It is to be noted that the interval between the upper side of the channel and the uppermost horizontal segment and the interval between the lower side of the channel and the lowermost horizontal segment are taken into consideration. For example, let the interval between adjoining horizontal segments be 2. In FIG. 5, each wiring density is calculated as follows. The wiring density D1 at the vertical segment 501 is $2+4+2=8$; the wiring density D2 at the vertical segment 502 is $2+4+2+3+2=13$; the wiring density D3 at the vertical segment 503 is $2+4+2+2+2+3+2=17$; the wiring density D4 at the vertical segment 504 is 17; the wiring density D5 at the vertical segment 505 is 11; and the wiring density D6 at the vertical segment 506 is 7. If the XY technique is employed, the wiring density at each location indicates the minimum channel height required for completing the channel wiring. Therefore, the maximum value in the channel densities indicates the channel height required for completing all the channel wirings. At step $2_4$, vertical segments are generated at the terminals 201, 202, and 203, and a wiring density at each location is calculated in order to find a set C of wiring densities, in which each location and the wiring density at each location are paired.

Step $2_5$ finds a subset C' of wiring densities, in which wiring densities greater than a certain value are enumerated from the set C of wiring densities. The subset C' is used in a calculation performed at step $2_6$. As apparent in the description made later with respect to step $2_6$, the reason for adopting the wiring densities greater than a certain value is that optimization at step $2_6$ may be lost if a certain wiring density is adopted.

Step $2_6$ evaluates how much each horizontal segment covers the elements contained in the subset C' of wiring densities. A horizontal segment covering more elements and crossing vertical segments of high wiring densities is required to be preferentially allocated to a track. The following equation (2) is employed for the evaluation, and let the result obtained therefrom be the attribute W2 of each segment L of the set H' of horizontal segments.

$$W2 = \Sigma \ (ki \times \text{the number of vertical segments of a wiring density Di crossing a horizontal segment}) \quad (2),$$

where ki is an arbitrary constant and $k1 \geq k2 \geq \ldots \geq ki$, Di is a wiring density contained in the subset C' of wiring densities and $D1 \geq D2 \geq \ldots \geq Di$. For example, referring to FIG. 5, the attribute W2 of the horizontal segment 401 is calculated. Let the wiring densities contained in the subset C' be 17 and 13. Since the horizontal segment 401 covers one wiring density 13 and two wiring densities 17, $W2 = (10 \times 2) + (5 \times 1) = 25$, where $k1 = 10$, $k2 = 5$.

Step $2_7$ evaluates how much a horizontal segment is attracted toward the upper side and lower side of a channel. For example, let it be assumed that a horizontal segment N needs to be connected with the upper side at four locations and with the lower side at two locations. It can be readily understood that the total length of wires becomes short if the horizontal segment N can be allocated as close to the upper side of the channel as possible. In this embodiment, since horizontal segments are allocated from the upper side toward the lower side, attraction toward the upper side is calculated at step $2_7$. If horizontal segments are allocated from the lower side to the upper side, attraction toward the lower side should be calculated. The attraction toward the upper side is calculated by an equation (3) shown below with respect to each horizontal segment L contained in the set H' of horizontal segments. Let the calculation result be the attribute W3 of the segment L.

$$W3 = (\text{the number of terminals of segment L on the upper side of a channel}) / (\text{the number of terminals of segment L}) \quad (3).$$

When a long or wide horizontal segment is preferentially allocated, two-layer overlap wiring can be easily performed at step $2_9$. To this end, equation (4) is used. Let the calculation result be the attribute W4 of all the horizontal segments L contained in the set H' of horizontal segments.

$$W4 = ki \times (\text{the length from left end to right end of a horizontal segment}) \times (\text{the width of the horizontal segment}) \quad (4),$$

where ki is an arbitrary constant. This calculation is performed at step $S2_8$.

Figure 6:
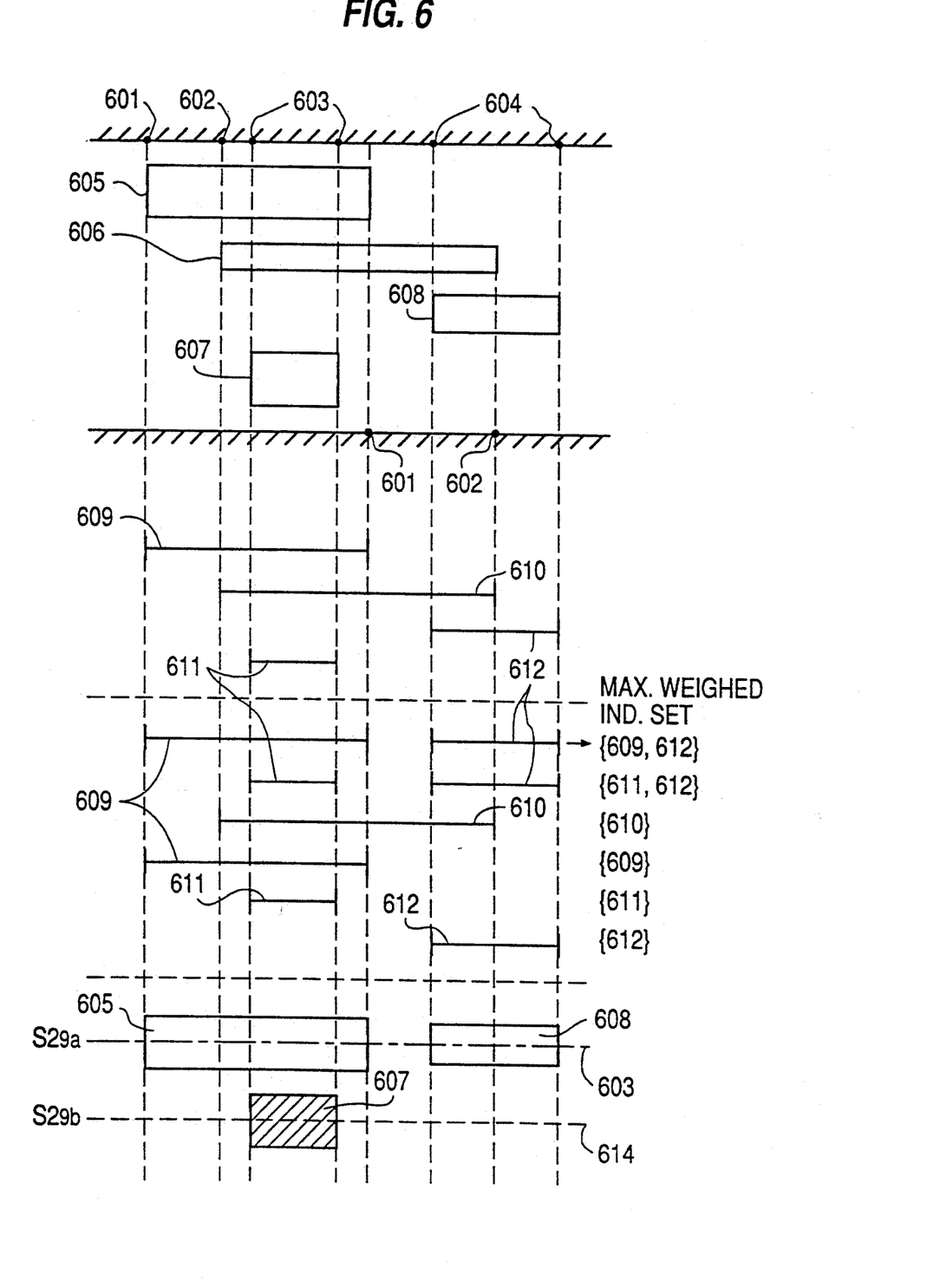
FIG. 6 is a schematic view explanatory of a step for selecting the horizontal segments.

Step $2_9$ is discussed with reference to FIG. 6. Reference numerals 601, 602, 603, and 604 denote a terminal of a net 1, that of a net 2, that of a net 3, and that of a net 4, respectively. Reference numerals 605, 606, 607, and 608 denote a horizontal segment of a wire having a width 4, that of a wire having a width 2, that of a wire having a width 4, and that of a wire having a width 3, respectively. Segments 609, 610, 611, and 612 are sectional representations of the horizontal segments 605, 606, 607, and 608, respectively. Furthermore, reference numerals 613 and 614 denote an imaginary segment of the first layer and that of the second layer, respectively. Step $2_9$ can be divided into steps $2_{9a}$ and $2_{9b}$, which differ from each other in allocating the horizontal segments to the imaginary segments.

All the horizontal segments L contained in the set H' of horizontal segments are initially indicated in sectional representation. For example, the horizontal segments 605, 606, 607, and 608 can be indicated as the sectional segments 609, 610, 611, and 612, respectively. Then, a weight W is applied to each sectional segment S with respect to each horizontal segment L. The weight W is calculated by equation (5) shown below.

$$W = k1 \times W1 + k2 \times W2 + k3 \times W3 + k4 \times W4 \quad (5),$$

where k1, k2, k3, and k4 are arbitrary constants. The greater the weight W is, the higher is the degree of selection priority of the segment to which the weight W is applied. Since W is the sum of W1 to W4, the degree of priority in W1 to W4 can be freely controlled by k1 to k4. In order to minimize the channel height, k1 and k2 are generally set to respective values greater than k3 and k4. The concept "maximum weighed independent set" in graph theory is used in order to find a set of horizontal segments to be selected or allocated. "Maximum weighed independent set" means a set of sectional segments not overlapping with each other and having respective weights of which the sum is maximum. The maximum weighed independent set is found with respect to the sectional segment S having the weight W previously found, and all the segments contained in the set are regarded as segments to be allocated. An example is described with reference to FIG. 6. Let the weights W of the sectional segments 609, 610, 611, and 612 be 12, 6, 8 and 6, respectively. Since the segments 609 and 610 overlap with each other in a certain section, these two segments cannot be contained in a single set. Similarly, the segments 610 and 611 cannot be contained in a single set. Furthermore, neither the segments 609 and 611 nor the segments 610 and 612 can belong to a single set. However, the segments 609 and 612 can belong to a single set {609, 612} because these two segments do not overlap with each other. Similarly, since the segments 611 and 612 do not overlap with each other, they can be contained in a single set {611, 612}. The weight of this set is $8 + 6 = 14$. Since the segment 610 overlaps with all the segments, the segment 610 itself can be regarded as a set {610} and the weight thereof is 8. The weights of the sets {610}, {609, 612}, {611, 612} are 8, 18, 14, respectively. Accordingly, the set {609, 612} is the maximum weighed independent set, and the segments 609 and 612 are selected. An algorithm for solving the maximum weighed independent set is conventionally known in (Journal of the Association for Computing Machinery, Vol. 33 No. 2, 1986, pp. 290-312). The algorithm shown in this journal is used in the present invention.

Subsequently, the imaginary segments 613 and 614 are generated and the horizontal segment 605 of the sectional segment 609 and the horizontal segment 608 of the sectional segment 612 are allocated on the imaginary segment 613 or 614. Such allocation is discussed with reference to FIG. 6. Terminals are initially enumerated which are located on the upper side of the channel within a section corresponding to the sectional segment 609 and are not equal to each other in electric potential. If such terminals are absent, the segment 609 is allocated on an imaginary segment on the same layer as terminals thereof. In the case of FIG. 6, the terminals 602 and 603 are present within a section corresponding to the segment 609. Accordingly, the segment 609 is allocated on an imaginary segment on a layer different from the layer on which the terminals thereof exist. In this case, the segment 609 is allocated on the imaginary segment 613 of the first layer (the terminals thereof exist on the second layer). The same operation is performed with respect to the segment 608. The horizontal segments 605 and 608 are removed from the set H' of horizontal segments. These operations are performed at step $2_{9a}$ of step $2_9$.

Although step $2_{9b}$ is almost the same as step $2_{9a}$, both steps differ from each other in allocating the horizontal segments on the imaginary segments. Similar to step $2_{9a}$, segments to be selected or allocated are initially found with respect to the segments L contained in the set H' of horizontal segments using the concept of "maximum weighed independent set". In FIG. 6, since the segments 609 and 612 have already been allocated, only the sets {610} and {611} exist. Accordingly, the maximum weighed independent set is the set {611}. Then, the horizontal segment 607 of the sectional segment 611 is allocated on an imaginary segment. Since the horizontal segments 605 and 608 have already been allocated on the imaginary segment 613, the horizontal segment 607 cannot be allocated on this imaginary segment 613 of the first layer. Accordingly, it is only necessary to examine whether the horizontal segment can be allocated on the imaginary segment 614 of the second layer. Since no terminals exist on the upper side of the channel within a section corresponding to the horizontal segment 607 in FIG. 6, the horizontal segment 607 is allocated on the imaginary segment 614. Thereafter, the horizontal segment 607 is removed from the set H' of horizontal segments.

Step $2_9$ including steps $2_{9a}$ and $2_{9b}$ enables two-layer overlap wiring. At steps $2_{9a}$ and $2_{9b}$, several horizontal segments are removed from the set H' of horizontal segments. A set H'' of horizontal segments is obtained by removing the horizontal segments removed from the set H' from the set H of horizontal segments.

Step 3 determines whether the allocation for all the horizontal segments is completed. If the allocation is not completed at step 3, the set H'' of horizontal segments is processed at the series of steps 2 in the above-described manner.

Figure 7A:
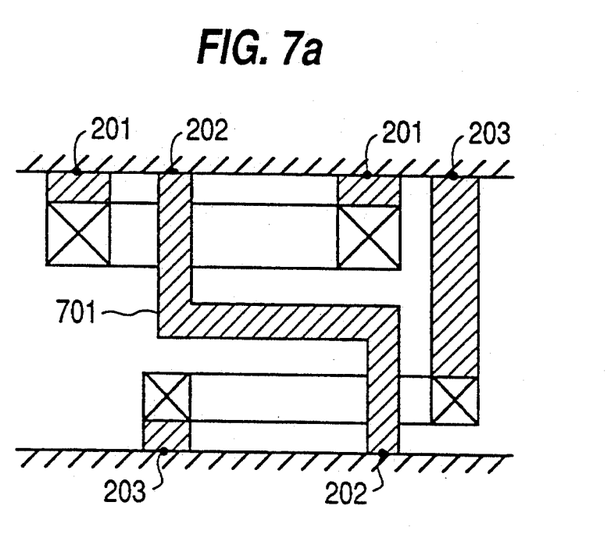
FIGS. 7a 7b and schematic views explanatory of a step for bending the horizontal segments.
Figure 7B:
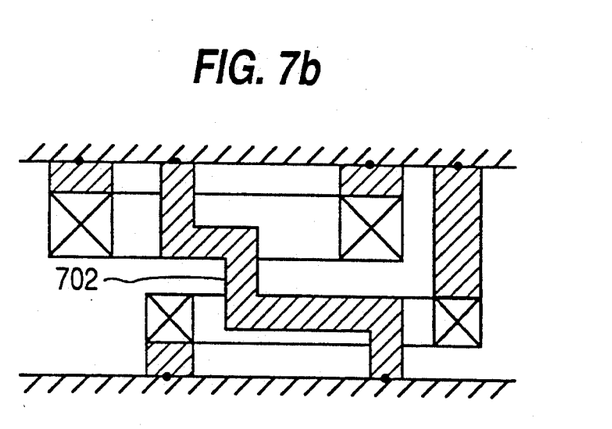

FIGS. 7a and 7b schematically indicate step 4 for bending horizontal segments.

Reference numeral 701 denotes a wire having a width 2 and lying only on one layer. This wire is bent as shown in FIG. 7b at step 4 where the channel is vertically compressed with respect to the wiring result obtained at the series of steps 2. The wiring in the channel formed by the compression must satisfy the design rules. The operation performed at step 4 is generally called "channel compaction". For example, "Nutcracker: An efficient and intelligent channel spacer" (Proc. 24th Design Automatic Conf., 1987, pp. 298-304), "A fast intelligent channel spacer with automatic jog insertion and via reduction" (Trans. IECE Japan, J72-A, No. 2, pp. 349-358, 1989, (Japanese version)), or any other suitable algorithm can be used for this purpose.

Finally, at step 5, necessary vertical segments are generated between terminals, between terminals and horizontal segments, and between horizontal segments for each layer in order to connect all the terminals as required.

Figure 8:
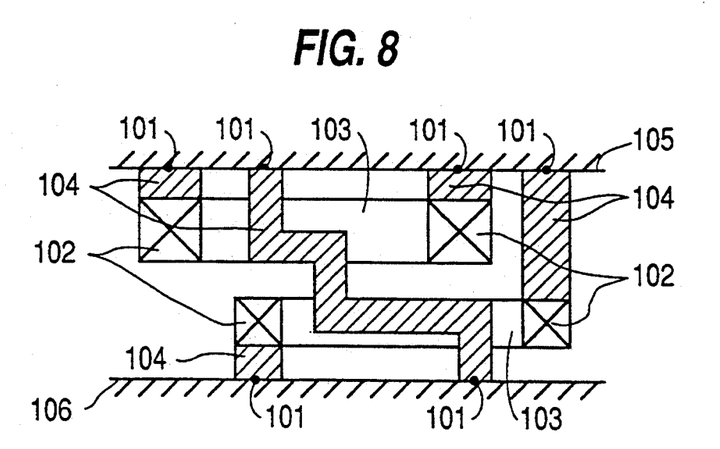
FIG. 8 is a schematic view of a wiring result obtained by the method according to the present invention.
Figure 9:
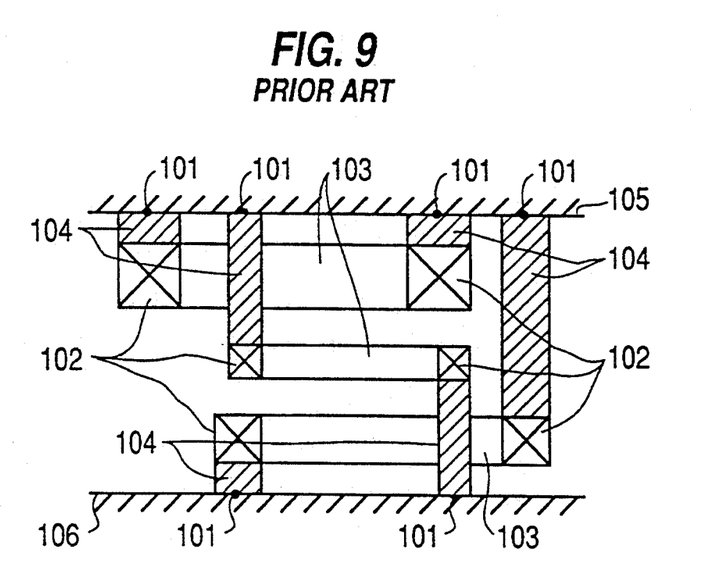
FIG. 9 is a schematic view of a wiring result obtained by the conventionally known "A variable width gridless channel router".

FIG. 8 schematically indicates a wiring result obtained by applying the present invention to a wiring problem. In FIG. 8, reference numeral 101 denotes a terminal; 102 denotes a contact, 103 denotes a wire on the first layer; 104 denotes a wire on the second layer; 105 denotes the upper side of a channel; and 106 denotes the lower side of the channel. FIG. 9 schematically indicates a wiring result obtained by applying the conventionally known variable width gridless channel router to the same wiring problem to which the present invention has been applied.

According to the present invention, a high density channel wiring having a low channel height can be obtained without using the XY technique. This is apparent from the comparison between the wiring result shown in FIG. 8 and that shown in FIG. 9.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A computer implemented channel routing method for determining the layout of a plurality of wires in a channel having a plurality of layers formed therein and sandwiched between two rows of terminals, said method comprising the steps of:

(a) generating horizontal segments required for completing a wiring in the channel;

(b) allocating said horizontal segments on at least one imaginary segment generated on each layer contained in the channel, said imaginary segment being in parallel with the rows of terminals in the channel;

(c) bending said horizontal segments for reduction of a channel height based on design rules for each layer; and (d) generating vertical segments of the wires;

said step (b) comprising the steps of:

(b1) determining an allocation order of said horizontal segments based on a positional relationship among said terminals;

(b2) selecting from said horizontal segments candidates which can be allocated on a single imaginary segment;

(b3) calculating a longest path length on an expanded vertical constraint graph required for completing the channel routing;

(b4) estimating in advance a channel height required for completing the channel routing;

(b5) enumerating locations of wiring densities greater than a given value, said wiring density being equal to a sum of widths of said horizontal segments and intervals between said horizontal segments along a vertical segment lying between said rows of terminal;

(b6) calculating a degree of crossing between each horizontal segment and vertical segments having respective wiring densities;

(b7) calculating an attraction of each horizontal segment toward one of an upper wide and a lower side of the channel;

(b8) calculating a degree of allocation priority of each horizontal segment; and (b9) selecting horizontal segments from said candidates and allocating selected horizontal segments on said imaginary segment based on a result obtained at at least one of said steps (b3), (b6), (b7), and (b8), and wherein said steps (b1) to (b9) are repeated until said horizontal segments are all allocated.

* * * * *